(12) United States Patent
Wang et al.

(10) Patent No.: US 11,263,941 B2
(45) Date of Patent: Mar. 1, 2022

(54) DATA DRIVING CIRCUIT, DRIVING METHOD THEREOF, ARRAY SUBSTRATE AND DISPLAY PANEL

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Xiaolin Wang, Beijing (CN); Pengcheng Fu, Beijing (CN); Rui Wang, Beijing (CN); Jungho Park, Beijing (CN); Xiaofeng Ma, Beijing (CN); Jianfeng Yuan, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 439 days.

(21) Appl. No.: 16/469,831

(22) PCT Filed: Jan. 3, 2019

(86) PCT No.: PCT/CN2019/070189
§ 371 (c)(1),
(2) Date: Jun. 14, 2019

(87) PCT Pub. No.: WO2020/007019
PCT Pub. Date: Jan. 9, 2020

(65) Prior Publication Data
US 2021/0358360 A1 Nov. 18, 2021

(30) Foreign Application Priority Data
Jul. 2, 2018 (CN) .......................... 201810706862.4

(51) Int. Cl.
*G09G 3/20* (2006.01)
*H01L 27/32* (2006.01)
*H01L 29/786* (2006.01)

(52) U.S. Cl.
CPC ........... *G09G 3/20* (2013.01); *H01L 27/3262* (2013.01); *G09G 2300/0426* (2013.01);
(Continued)

(58) Field of Classification Search
CPC ............. G09G 3/20; G09G 2310/0275; G09G 2310/08; G09G 2310/0267;
(Continued)

(56) References Cited

U.S. PATENT DOCUMENTS

2006/0250332 A1  11/2006  Lo et al.
2010/0289786 A1  11/2010  Tanaka et al.
(Continued)

FOREIGN PATENT DOCUMENTS

CN  1819005 A    8/2006
CN  105469752 A  4/2016
(Continued)

OTHER PUBLICATIONS

PCT International Search Report, Application No. PCT/CN2019/070189, dated Mar. 27, 2019, 10 pages: with English translation.
(Continued)

*Primary Examiner* — Andrew Sasinowski
(74) *Attorney, Agent, or Firm* — Armstrong Teasdale LLP

(57) ABSTRACT

Embodiments of the present disclosure relate to a data driving circuit, a driving method thereof, an array substrate, and a display panel. The data driving circuit includes a data driver, a multiplex circuit, and a control circuit. The data driver includes M data output terminals, and each of the data output terminals provides a data signal to L data lines via the multiplex circuit. The multiplex circuit includes M×L switch
(Continued)

groups, and each of the switch groups includes N switch tubes and is coupled between one data line and the corresponding data output terminal. Each switch tube is coupled to one of L×N gate control terminals of the control circuit. Each gate control terminal is coupled to M switch tubes that are spaced apart from each other by (L×N×1) switch tubes. In the embodiments, M is an integer, and L and N are integers greater than or equal to 2.

15 Claims, 5 Drawing Sheets

(52) U.S. Cl.
CPC .............. *G09G 2310/0267* (2013.01); *G09G 2310/0275* (2013.01); *G09G 2310/0297* (2013.01); *G09G 2310/08* (2013.01); *H01L 29/7869* (2013.01)

(58) Field of Classification Search
CPC .... G09G 2310/0297; G09G 2300/0426; H01L 27/3262; H01L 29/7869
See application file for complete search history.

(56) References Cited

U.S. PATENT DOCUMENTS

| | | | | |
|---|---|---|---|---|
| 2017/0125503 | A1* | 5/2017 | Ota | H01L 27/3265 |
| 2017/0153695 | A1* | 6/2017 | Kawashima | G06F 1/1643 |
| 2017/0154945 | A1* | 6/2017 | Shin | H01L 27/3276 |
| 2017/0185190 | A1* | 6/2017 | Jung | H01L 27/1225 |
| 2017/0200412 | A1* | 7/2017 | Gu | G09G 5/005 |
| 2017/0344179 | A1* | 11/2017 | Kim | G06F 3/04166 |
| 2017/0365209 | A1* | 12/2017 | Kurokawa | G06F 3/0416 |
| 2018/0005575 | A1* | 1/2018 | Lee | G09G 3/3225 |

FOREIGN PATENT DOCUMENTS

| | | |
|---|---|---|
| CN | 105679272 A | 6/2016 |
| CN | 206194295 U | 5/2017 |
| CN | 106940992 A | 7/2017 |
| CN | 108550342 A | 9/2018 |

OTHER PUBLICATIONS

PCT Written Opinion, Application No. PCT/CN2019/070189, dated Mar. 27, 2019, 7 pages.: with English translation of relevant part.
China First Office Action, Application No. 201810706862.4, dated Apr. 16, 2019, 15 pps.: with English translation.
China Second Office Action, Application No. 201810706862.4, dated Sep. 25, 2019, 12 pps.: with English translation.

* cited by examiner

DATA DRIVING CIRCUIT, DRIVING METHOD THEREOF, ARRAY SUBSTRATE AND DISPLAY PANEL

CROSS REFERENCE TO RELATED APPLICATIONS

This patent application is a National Stage Entry of PCT/CN2019/070189 filed on Jan. 3, 2019, which claims the benefit and priority of Chinese Patent Application No. 201810706862.4 filed on Jul. 2, 2018, the disclosures of which are incorporated by reference herein in their entirety as part of the present application.

BACKGROUND

The present disclosure relates to the field of display technology, and more particularly, relates to a data driving circuit, a driving method thereof, an array substrate, and a display panel.

Currently, a display panel with a narrow frame has become a trend. In the display panel, a multiplex circuit can be used to multiplex data output lines, thereby reducing an amount of data output terminals to implement the narrow frame. Generally, the multiplex circuit can be implemented by using an oxide thin film transistor (TFT).

BRIEF DESCRIPTION

Embodiments of the present disclosure provide a data driving circuit, an array substrate, a display panel, and a method for driving the data driving circuit.

A first aspect of the present disclosure provides a data driving circuit. The data driving circuit includes a data driver, a multiplex circuit, and a control circuit. The data driver includes M data output terminals, and each of the data output terminals provides a data signal to L data lines via the multiplex circuit. The multiplex circuit includes M×L switch groups, and each of the switch groups includes N switch tubes and is coupled between one data line and the corresponding data output terminal. Each of the switch tubes is coupled to one of L×N gate control terminals of the control circuit, and is configured to provide the data signal from the corresponding data output terminal to the corresponding data line according to a control signal from the coupled gate control terminal. Each of the gate control terminals is coupled to M switch tubes that are spaced apart from each other by (L×N−1) switch tubes, and is configured to provide the control signal to the corresponding switch tubes. M is an integer, and L and N are integers greater than or equal to 2.

In an embodiment of the present disclosure, the switch tube may be an oxide thin film transistor. A gate electrode of the oxide thin film transistor is coupled to the gate control terminal, a first electrode is coupled to the data output terminal, and a second electrode is coupled to the data line.

In an embodiment of the present disclosure, the data output terminal at an odd number position and the data output terminal at a next even number position may be alternately coupled to the adjacent 2 L data lines through the multiplex circuit.

In an embodiment of the present disclosure, M data output terminals may be each coupled to the adjacent L data lines through the multiplex circuit.

In an embodiment of the present disclosure, N may be 2, 3, or 4.

In an embodiment of the present disclosure, L may be 2 or 3.

A second aspect of the present disclosure provides an array substrate. The array substrate includes a scan driving circuit, the data driving circuit according to the first aspect of the present disclosure, and a pixel circuit. The scan driving circuit is configured to provide a scan signal to the pixel circuit through a scan line. The data driving circuit is configured to provide a data signal to the pixel circuit through a data line.

A third aspect of the present disclosure provides a display panel. The display panel includes the array substrate according to the second aspect of the present disclosure.

A fourth aspect of the present disclosure provides a driving method for driving the data driving circuit according to the first aspect of the present disclosure. In the driving method, in each of N time periods, a control signal is provided from L gate control terminals sequentially, such that one switch tube of each switch group is enabled to provide a data signal from the data output terminal to the data line. In different time periods, the L gate control terminals are different and the enabled switch tube of each switch group is different.

In an embodiment of the present disclosure, each of the time periods includes one or more scan cycles.

BRIEF DESCRIPTION OF THE DRAWINGS

In order to illustrate the technical solutions of the embodiments of the present disclosure more clearly, drawings of the embodiments will be briefly described below. It should be appreciated that the drawings described below only relate to some embodiments of the present disclosure, rather than limiting the present disclosure, wherein throughout the various diagrams of these drawings, corresponding reference numerals indicate corresponding parts or features.

DETAILED DESCRIPTION

Figure 1:
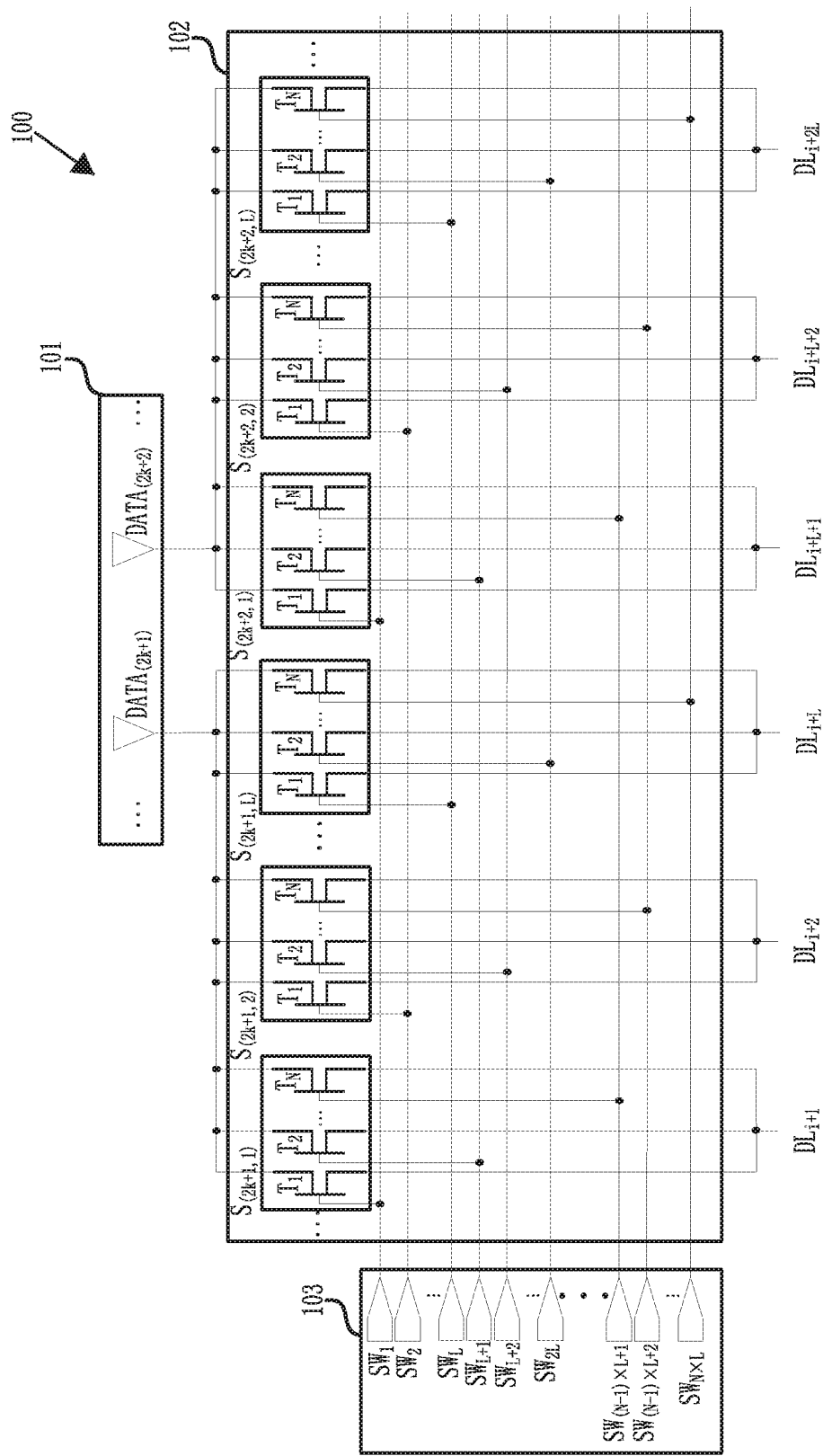
FIG. 1 is a schematic circuit diagram of the data driving circuit according to some embodiments of the present disclosure.

In order to make the technical solutions and advantages of the embodiments of the present disclosure clearer, the technical solutions in the embodiments of the present disclosure will be clearly and completely described below in detail, in conjunction with the drawings. Obviously, the described embodiments are merely some but not all of embodiments of the present disclosure. Based on the described embodiments of the present disclosure, all other embodiments obtained by those skilled in the art without creative efforts shall fall within the protecting scope of the present disclosure.

The terms "a", "one", "this" and "the" are intended to mean the presence of one or more elements when introducing elements of the present disclosure and their embodiments. The terms "comprising", "including", "containing", and "having" are intended to be inclusive and to indicate that there may be additional elements other than the listed elements.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein. As employed herein, the description of "connecting" or "coupling" two or more parts together should refer to the parts being directly combined together or being combined via one or more intermediate components.

In the embodiments of the present disclosure, since a source and a drain (or an emitter and a collector) of a transistor are symmetrical, and a conduction current between a source and a drain of an N-type transistor is opposite in direction to that between a source and a drain of a P-type transistor, a controlled intermediate terminal of the transistor is referred to as a control electrode, a signal input terminal is referred to as a first electrode, and a signal output terminal is referred to as a second electrode. The transistor used in the embodiments of the present disclosure is basically a switching transistor. In addition, the terms such as "first" and "second" are only used to distinguish one element (or one part of the element) from another element (or another part of the component).

In the case that the multiplex circuit employing the oxide TFT is applied in the field of display technology, the oxide TFT is in a high frequency charging and discharging state for a long time. Due to the oxide TFT's low reliability, a threshold voltage of the oxide TFT is positively drifted, resulting in insufficient charging of a display device coupled to the multiplex circuit. For example, the pixel driving circuit of the display device is not fully charged, and thus the display panel of the display device does not work normally. In addition, being in a high frequency charging and discharging state for a long time would reduce the lifetime of the transistor, thereby affecting the lifetime of the multiplex circuit and the display device.

Some embodiments of the present disclosure provide the data driving circuit which can reduce the high frequency charging and discharging duration, thereby improving the reliability of the multiplex circuit. FIG. 1 is a schematic circuit diagram of the data driving circuit 100 according to some embodiments of the present disclosure. As shown in FIG. 1, the data driving circuit 100 may include a data driver 101, a multiplex circuit 102, and a control circuit 103.

In some embodiments of the present disclosure, the data driver 101 includes M data output terminals. Each data output terminal may output the data signal to the corresponding L data lines via the multiplex circuit 102. The multiplex circuit 102 may include M×L switch groups. Each switch group may include N switch tubes (e.g., $T_1, \ldots, T_N$) and is coupled between one data line and the corresponding data output terminal. Each switch tube is coupled to one of L×N gate control terminals of the control circuit 103. The switch tube may output the data signal from the corresponding data output terminal to the corresponding data line according to a control signal from the coupled gate control terminal. Each gate control terminal is coupled to M switch tubes that are spaced apart from each other by (L×N−1) switch tubes, and provides the control signal to the corresponding switch tubes. In some embodiments of the present disclosure, M may be an integer, and L and N may be integers greater than or equal to 2.

For the convenience of description, FIG. 1 only shows the case where two data output terminals $DATA_{(2k+1)}$ and $DATA_{(2k+2)}$ are connected to the multiplex circuit 102. As shown in FIG. 1, the data output terminal $DATA_{(2k+1)}$ may output the data signal to the respective one of the L data lines $DL_{i+1}, \ldots, DL_{i+L}$ via the respective switch groups $S_{(2k+1, 1)}, \ldots, S_{(2k+1, L)}$. The data output terminal $DATA_{(2k+2)}$ may output the data signal to the respective one of the L data lines $DL_{i+1}, \ldots, DL_{i+2L}$ via the respective switch groups $S_{(2k+2, 1)}, \ldots, S_{(2k+2, L)}$. For example, for the data output terminal $DATA_{(2k+1)}$, the first electrodes of the N switch tubes $T_1$ to $T_N$ of the switch group $S_{(2k+1, 1)}$ are connected in parallel to the data output terminal $DATA_{(2k+1)}$, the second electrodes are connected in parallel to the data line $DL_{i+1}$, and the control electrodes are connected to the respective gate control terminals $SW_1$, $SW_{L+1}$, $SW_{2L+1}, \ldots, SW_{(N-1)\times L+1}$ which are spaced apart from each other by L gate control terminals. Thus, the switch group $S_{(2k+1, 1)}$ may control ON/OFF of the N switch tubes $T_1$ to $T_N$ according to the gate control signals provided by the gate control terminals $SW_1$, $SW_{L+1}$, $SW_{2L+1}, \ldots, SW_{(N-1)\times L+1}$ which are spaced apart from each other by L control terminals, and thus the data signal from the data output terminal $DATA_{(2k+1)}$ is outputted to the data line $DL_{i+1}$. The connections and functions of the switch tubes of the switch groups coupled to other data output terminals are similar to those as described above.

Furthermore, for example, for the gate control terminal $SW_1$, the control electrode of the switch tube $T_1$ of the switch group $S_{(2k+1, 1)}$ and the control electrode of the switch tube $T_1$ of the switch group $S_{(2k+2, 1)}$ are connected in parallel to the gate control terminal $SW_1$. The switch tube $T_1$ of the switch group $S_{(2k+1, 1)}$ is separated from the switch tube $T_1$ of the switch group $S_{(2k+2, 1)}$ by (L×N−1) switch tubes. In the case where the data driver 101 has M data output terminals, the control electrodes of M switch tubes $T_1$ are connected in parallel to the gate control terminal $SW_1$. The two adjacent switch tubes $T_1$ of the M switch tubes $T_1$ are separated by (L×N−1) switch tubes. The gate control terminal $SW_1$ may provide the gate control signal to the M switch tubes $T_1$ to control ON/OFF of the M switch tubes $T_1$.

In the embodiment shown in FIG. 1, as an example, the data output terminal $DATA_{(2k+1)}$ may output the data signal to the respective one of the adjacent L data lines $DL_{i+1}, \ldots, DL_{i+L}$ via the respective switch groups $S_{(2k+1, 1)}, \ldots, S_{(2k+1, L)}$, and the data output terminal $DATA_{(2k+2)}$ may output the data signal to the respective one of the adjacent L data lines $DL_{i+1}, \ldots, DL_{i+2L}$ via the respective switch groups $S_{(2k+2, 1)}, \ldots, S_{(2k+2, L)}$. In addition, in some embodiments of the present disclosure, the data output terminal $DATA_{(2k+1)}$ at an odd number position and the data output terminal $DATA_{(2k+2)}$ at a next even number position may be alternately coupled to the adjacent 2 L data lines through the multiplex circuit 102, which will be described in detail below with reference to FIGS. 4 and 5. In some embodiments of the present disclosure, the switch tube may be an oxide TFT. The control electrode of the oxide TFT may be coupled to the gate control terminal, the first electrode may be coupled to the data output terminal, and the second electrode may be coupled to the data line. In the embodiment shown in FIG. 1, for example, the switch tube $T_1$ of $S_{(2k+1,\ 1)}$ may be an oxide TFT, wherein the control electrode of $T_1$ is coupled to the gate control terminal $SW_1$, the first electrode is coupled to the data output terminal $DATA_{(2k+1)}$, and the second electrode is coupled to the data line $DL_{i+1}$.

Figure 2:
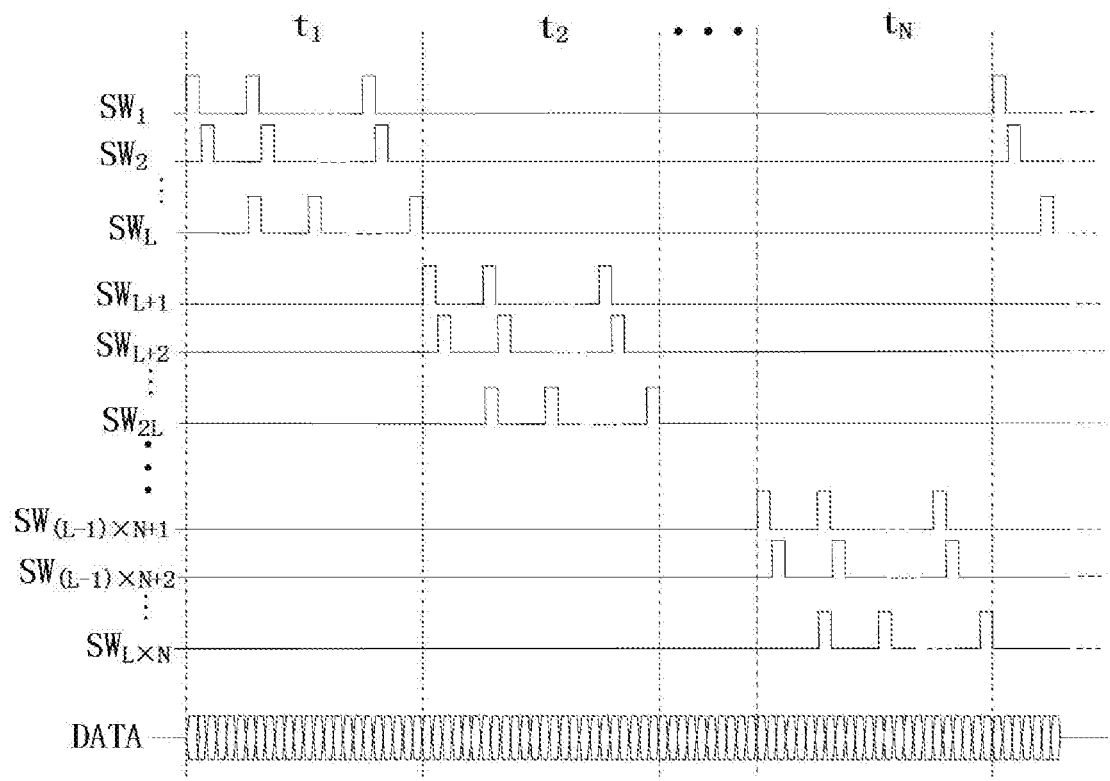
FIG. 2 is a diagram illustrating a timing sequence of the respective signals for the data driving circuit as shown in FIG. 1.

It should be appreciated that, in addition to the oxide TFT, the switch tube may be other types of transistor, such as a polycrystalline silicon transistor, a monocrystalline silicon transistor and the like. FIG. 2 is a diagram illustrating a timing sequence of the respective signals for the data driving circuit shown in FIG. 1. The operation of the data driving circuit as shown in FIG. 1 will be described in detail below with reference to the timing sequence shown in FIG. 2. The data output terminal $DATA_{(2k+1)}$ will be taken as an example. During the time period $t_1$, the gate control terminals $SW_1, \ldots, SW_L$ provide the gate control signals to the L switch tubes $T_1$ of the switch groups $S_{(2k+1,\ 1)}, S_{(2k+1,\ L)}$ sequentially, such that the L switch tubes $T_1$ are turned on sequentially, and thus the data signal from the data output terminal $DATA_{(2k+1)}$ is outputted to the data lines $DL_{i+1}, \ldots, DL_{i+L}$ sequentially. This process will be repeated until the end of the time period $t_1$. During the time period $t_2$, the gate control terminals $SW_{L+1}, \ldots, SW_{2L}$ provide the gate control signals to the L switch tubes $T_2$ of the switch groups $S_{(2k+1,\ 1)}, \ldots, S_{(2k+1,\ L)}$ sequentially. The rest of the process is similar to that during the time period $t_1$. Similar to the time periods $t_1$ and $t_2$, the process in the time periods $t_3$ to $t_N$ are performed. As described above, the L gate control terminals $SW_1, \ldots, SW_L$ in the time period $t_1$ are different from the L gate control terminals $SW_{L+1}, \ldots, SW_{2L}$ in the time period $t_2$. It should be appreciated that in the different time periods $t_1, \ldots, t_N$ shown in FIG. 2, each gate control terminal provides the gate control signal in one time period only, and each switch tube is enabled in one time period only to output the data signal to the coupled data line.

In some embodiments of the present disclosure, the time periods $t_1, \ldots, t_N$ may be 2 or 3 seconds.

Figure 3:
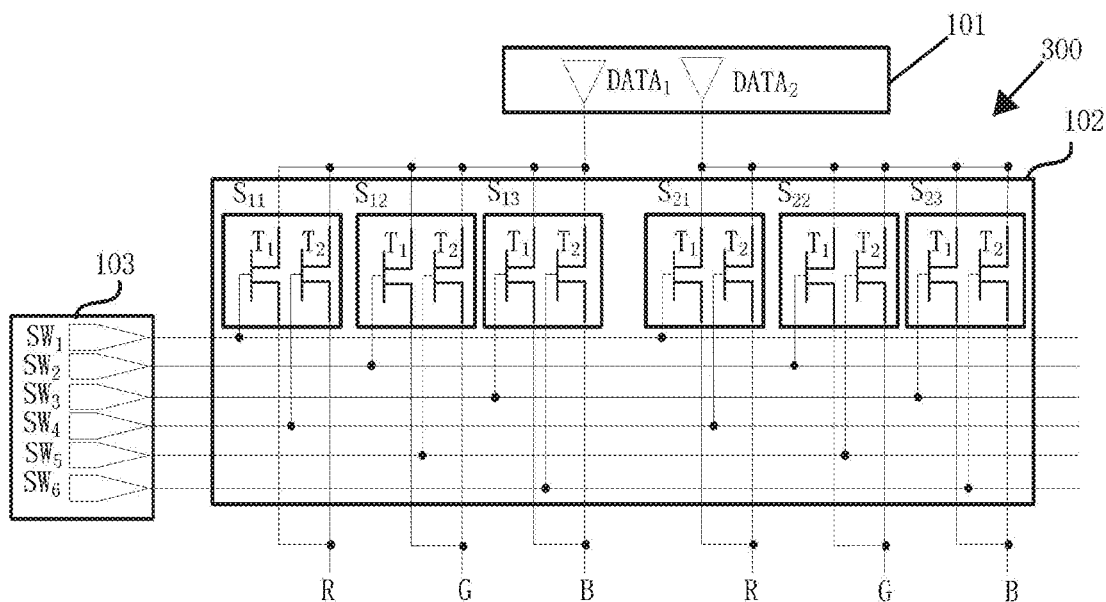
FIG. 3 is an exemplary circuit diagram of the data driving circuit according to some embodiments of the present disclosure.

FIG. 3 is an exemplary circuit diagram 300 of the data driving circuit according to some embodiments of the present disclosure, in which M is 2, N is 2, and L is 3. The data output lines are coupled to sub-pixel columns arranged in the order of R, G, and B. As shown in FIG. 3, the data driving circuit includes two data output terminals $DATA_1$ and $DATA_2$. The data output terminal $DATA_1$ outputs the data signal to three adjacent R, G, and B sub-pixel columns via the three switch groups $S_{11}$, $S_{12}$, and $S_{13}$, respectively. Each switch group includes two switch tubes $T_1$ and $T_2$. For the switch group $S_{11}$, the first electrodes of the switch tubes $T_1$ and $T_2$ are connected in parallel to the data output terminal $DATA_1$, the second electrodes are connected in parallel to the R sub-pixel column, and the control electrodes are connected to the gate control terminals $SW_1$, $SW_4$. For the switch group $S_{12}$, the first electrodes of the switch tubes $T_1$ and $T_2$ are connected in parallel to the data output terminal $DATA_1$. The second electrodes are connected in parallel to the G sub-pixel column, and the control electrodes are connected to the gate control terminals $SW_2$, $SW_5$. For the switch group $S_{13}$, the first electrodes of the switch tubes $T_1$ and $T_2$ are connected in parallel to the data output terminal $DATA_1$. The second electrodes are connected in parallel to the B sub-pixel column, and the control electrodes are connected to the gate control terminals $SW_3$, $SW_6$. The connections for the data output terminal $DATA_2$ are similar to those for the data output terminal $DATA_1$.

Figure 4:
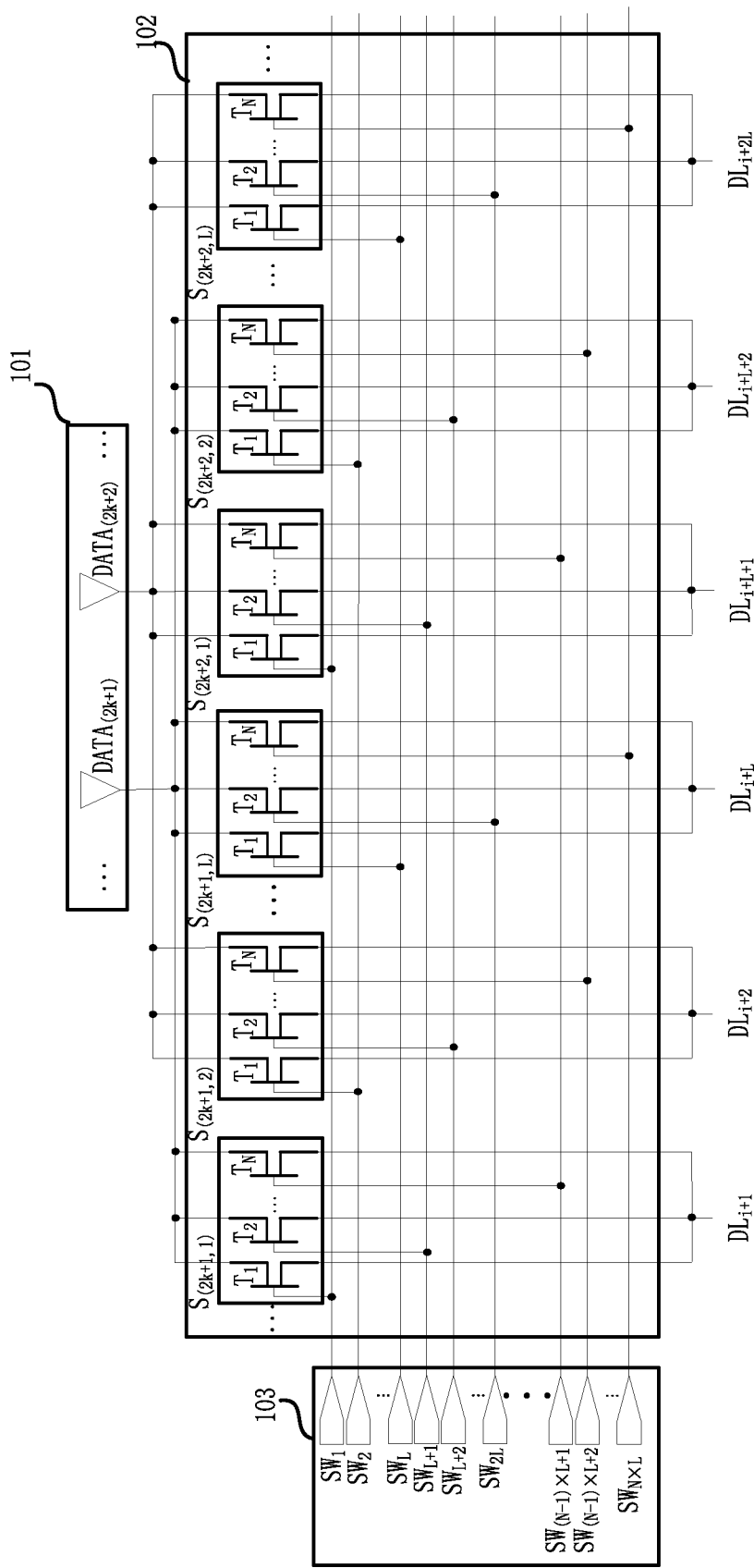
FIG. 4 is a schematic circuit diagram of the data driving circuit according to some embodiments of the present disclosure.

FIG. 4 is a schematic diagram of the data driving circuit according to some embodiments of the present disclosure. In the data driving circuit as shown, the data output terminal at the odd number position and the data output terminal at the next even number position are alternately coupled to the adjacent 2 L data lines through the multiplex circuit 102. As shown in FIG. 4, the data output terminal $DATA_{(2k+1)}$ may output the data signal to the respective one of the L data lines at the odd number positions via the respective switch groups at the odd number positions. The data output terminal $DATA_{(2k+2)}$ may output the data signal to the respective one of L data lines at the even number positions via the respective switch groups at the even number positions. Other connections and the functions of the components in the embodiment shown in FIG. 4 are similar to those in the embodiment shown in FIG. 1.

Figure 5:
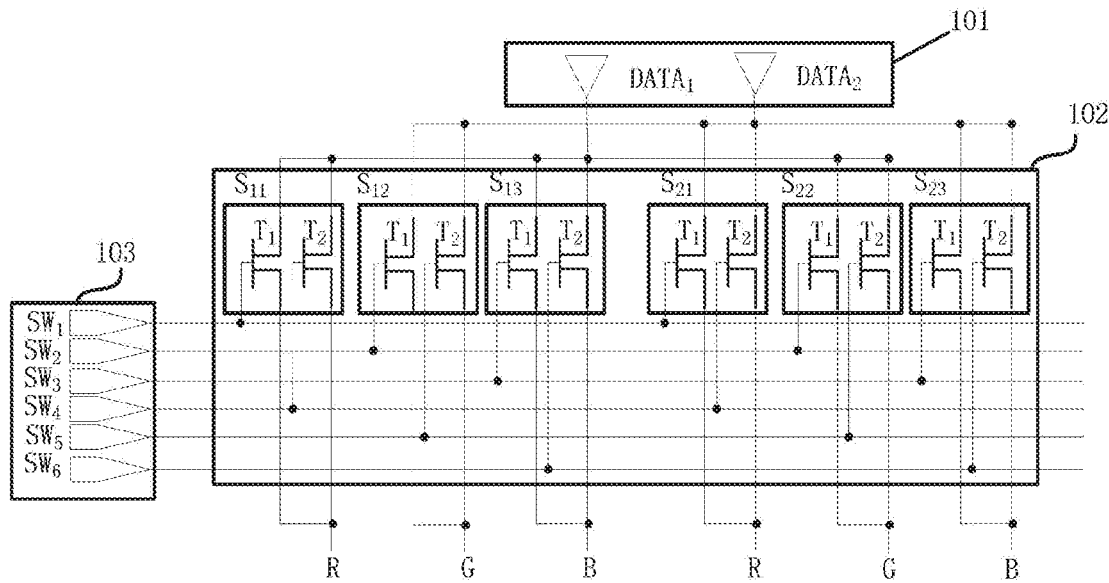
FIG. 5 is another exemplary circuit diagram of the data driving circuit according to some embodiments of the present disclosure.

FIG. 5 is another exemplary circuit diagram of the data driving circuit according to some embodiments of the present disclosure, in which M is 2, N is 2, and L is 3. The data output lines are coupled to the sub-pixel columns arranged in the order of R, G, and B. In the data driving circuit shown in FIG. 5, the data output terminal $DATA_1$ may output the data signal to the R, B, G sub-pixel columns at the first, third, and fifth positions via the switch groups $S_{11}$, $S_{13}$, and $S_{22}$ at the first, third, and fifth positions, respectively. The data output terminal $DATA_2$ may output the data signal to the G, R, B sub-pixel columns at the second, fourth, and sixth positions via the switch groups $S_{12}$, $S_{21}$, and $S_{23}$ at the second, fourth, and sixth positions, respectively. Other connections and functions of the components in the embodiment shown in FIG. 5 are similar to those in the embodiment shown in FIG. 3, which will not be described in detail here.

Figure 6:
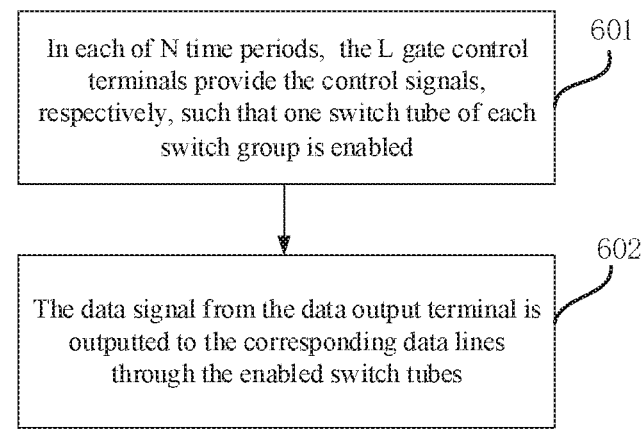
FIG. 6 is a schematic flowchart of the method for driving the data driving circuit according to some embodiments of the present disclosure.

FIG. 6 is a schematic flowchart of the method for driving the data driving circuit according to some embodiments of the present disclosure. As shown in FIG. 6, at step 601, in each of N time periods, the L gate control terminals provide the control signals sequentially, such that one switch tube in each switch group is enabled. Then, at step 602, the data signals from the data output terminals are outputted to the corresponding data lines through the enabled switch tubes.

This process is similar to that described with reference to FIG. 2, which will not be described in detail here.

Figure 7:
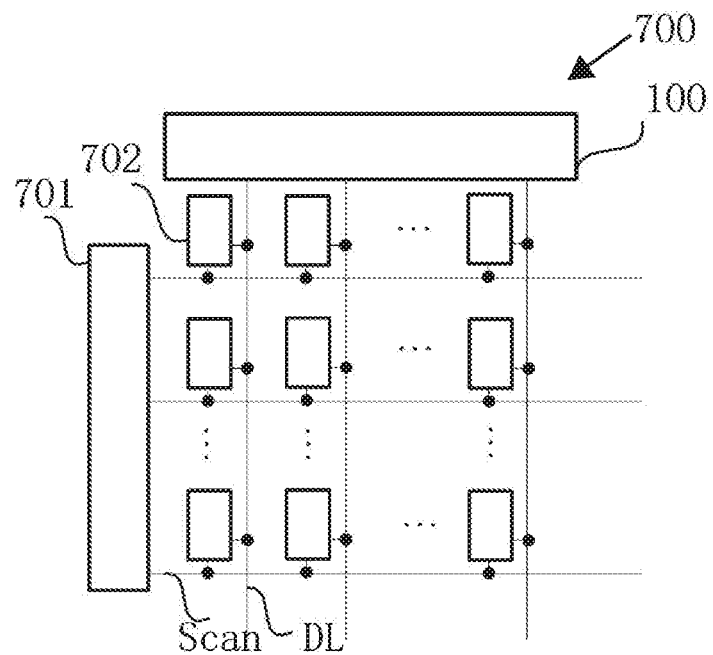
FIG. 7 is a schematic block diagram of the array substrate according to some embodiments of the present disclosure.

FIG. 7 is a schematic block diagram of the array substrate 700 according to some embodiments of the present disclosure. As shown in FIG. 7, the array substrate 700 includes a scan driving circuit 701, the data driving circuit 100 as shown in FIG. 1, and a pixel circuit 702. In some embodiments of the present disclosure, the scan driving circuit 701 may provide a scan signal to the pixel circuit 702 through scan lines Scan. The data driving circuit 100 may provide the data signals to the pixel circuit 702 through the data lines DL.

Figure 8:
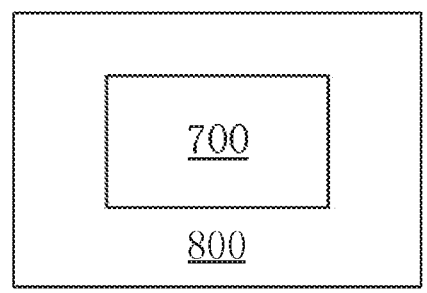
FIG. 8 is a schematic block diagram of the display panel according to some embodiments of the present disclosure.

FIG. 8 is a schematic diagram of the display panel according to some embodiments of the present disclosure. As shown in FIG. 8, the display panel includes the array substrate 700 as shown in FIG. 7. The display panel 800 according to the embodiment of the present disclosure can be used for any product or component with a display function. Such product or component may include, but not limited to, a display panel, a wearable device, a mobile phone, a tablet, a television, a laptop computer, a digital photo frames, a navigator, and the like.

Although some specific embodiments have been described herein, they are presented by way of example only and are not intended to limit the scope of the disclosure. In fact, the novel embodiments described herein can be implemented in various other forms. In addition, various omissions, replacements, and modifications to the embodiments described herein may be made without departing from the scope and the spirit of the present disclosure. The appended claims and their equivalents are intended to cover such forms or modifications that fall within the scope and spirit of the present disclosure.

What is claimed is:

1. A data driving circuit comprising a data driver, a multiplex circuit, and a control circuit;
   wherein the data driver comprises M data output terminals, and each of the data output terminals provides a data signal to L data lines via the multiplex circuit;
   wherein the multiplex circuit comprises M×L switch groups, and each of the switch groups comprises N switch tubes and is coupled between one of the data output terminals and one of the corresponding L data lines;
   wherein each of the switch tubes is coupled to one of L×N gate control terminals of the control circuit, and is configured to provide the data signal from the corresponding data output terminal to the corresponding data line according to a control signal from the coupled gate control terminal;
   wherein each of the gate control terminals is coupled to M switch tubes that are spaced apart from each other by (L×N−1) switch tubes, and is configured to provide the control signal to the corresponding switch tubes; and
   wherein M is an integer, and L and N are integers greater than or equal to 2.

2. The data driving circuit according to claim 1, wherein the switch tube is an oxide thin film transistor, wherein a gate electrode of the oxide thin film transistor is coupled to the gate control terminal, wherein a first electrode is coupled to the data output terminal, and wherein a second electrode is coupled to the data line.

3. The data driving circuit according to claim 1, wherein the data output terminal at an odd number position and the data output terminal at a next even number position are alternately coupled to the adjacent 2 L data lines through the multiplex circuit.

4. The data driving circuit according to claim 1, wherein the M data output terminals are each coupled to the adjacent L data lines through the multiplex circuit.

5. The data driving circuit according to claim 1, wherein N is 2, 3, or 4.

6. The data driving circuit according to claim 1, wherein L is 2 or 3.

7. An array substrate comprising a scan driving circuit, the data driving circuit according to claim 1, and a pixel circuit;
   wherein the scan driving circuit is configured to provide a scan signal to the pixel circuit through a scan line; and
   wherein the data driving circuit is configured to provide a data signal to the pixel circuit through a data line.

8. A display panel comprising the array substrate according to claim 7.

9. The array substrate according to claim 7, wherein the switch tube is an oxide thin film transistor, wherein a gate electrode of the oxide thin film transistor is coupled to the gate control terminal, wherein a first electrode is coupled to the data output terminal, and wherein a second electrode is coupled to the data line.

10. The array substrate according to claim 7, wherein the data output terminal at an odd number position and the data output terminal at a next even number position are alternately coupled to the adjacent 2 L data lines through the multiplex circuit.

11. The array substrate according to claim 7, wherein the M data output terminals are each coupled to the adjacent L data lines through the multiplex circuit.

12. The array substrate according to claim 7, wherein N is 2, 3, or 4.

13. The array substrate according to claim 7, wherein L is 2 or 3.

14. A driving method for driving the data driving circuit according to claim 1, the method comprising:
   providing, in each of N time periods, a control signal from L gate control terminals sequentially, such that one switch tube of each switch group is enabled to provide a data signal from the output terminal to the data line;
   wherein in different time periods, the L gate control terminals are different and the enabled switch tube of each switch group is different.

15. The driving method according to claim 14, wherein each of the time periods comprises at least one scan cycle.

* * * * *

UNITED STATES PATENT AND TRADEMARK OFFICE
CERTIFICATE OF CORRECTION

PATENT NO. : 11,263,941 B2
APPLICATION NO. : 16/469831
DATED : March 1, 2022
INVENTOR(S) : Xiaolin Wang et al.

Page 1 of 1

It is certified that error appears in the above-identified patent and that said Letters Patent is hereby corrected as shown below:

In the Specification

Column 4, Line 18, "$DL_{i+1}$" should read -- $DL_{i+L+1}$ --.
Column 4, Line 26, "$SW_{(N-1 \times L+1)}$" should read -- $SW_{(N-1) \times L+1}$ --.
Column 4, Line 30, "$SW_{(N-1 \times L+1)}$" should read -- $SW_{(N-1) \times L+1}$ --.
Column 4, Line 57, "$DL_{i+1}$" should read -- $DL_{i+L+1}$ --.

Signed and Sealed this
Seventeenth Day of May, 2022

Katherine Kelly Vidal
*Director of the United States Patent and Trademark Office*